(12) United States Patent
Tomita

(10) Patent No.: US 6,853,871 B2
(45) Date of Patent: Feb. 8, 2005

(54) EXPOSURE APPARATUS

(75) Inventor: Hiroyuki Tomita, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 258 days.

(21) Appl. No.: 09/919,850

(22) Filed: Aug. 2, 2001

(65) Prior Publication Data

US 2002/0026260 A1 Feb. 28, 2002

(30) Foreign Application Priority Data

Aug. 9, 2000 (JP) ........................................ 2000-241633

(51) Int. Cl.$^7$ .......................... G06F 19/00; G05D 16/00
(52) U.S. Cl. ...................................... 700/121; 700/301
(58) Field of Search ................................ 700/121, 301; 716/21

(56) References Cited

U.S. PATENT DOCUMENTS

| | | | | |
|---|---|---|---|---|
| 4,690,528 | A | * 9/1987 | Tanimoto et al. | ........... 353/101 |
| 5,877,843 | A | * 3/1999 | Takagi et al. | ................. 355/30 |
| 5,892,572 | A | * 4/1999 | Nishi | ........................... 355/67 |
| 6,138,670 | A | * 10/2000 | Delauze et al. | ........ 128/201.27 |
| 6,244,923 | B1 | * 6/2001 | Komaba | ...................... 446/224 |
| 6,267,131 | B1 | * 7/2001 | Masada et al. | ............... 137/12 |
| 6,545,746 | B1 | * 4/2003 | Nishi | .......................... 355/53 |
| 2002/0006561 | A1 | * 1/2002 | Taniguchi | .................... 430/22 |
| 2002/0033934 | A1 | 3/2002 | Ishii | ............................. 355/30 |
| 2002/0145711 | A1 | * 10/2002 | Magome et al. | .............. 355/30 |
| 2003/0020888 | A1 | * 1/2003 | Tanaka et al. | ................ 355/30 |

FOREIGN PATENT DOCUMENTS

| | | |
|---|---|---|
| JP | 5-210049 | 8/1993 |
| JP | 11-297620 | 10/1999 |
| JP | 2000-56197 | 2/2000 |

* cited by examiner

Primary Examiner—Leo Picard
Assistant Examiner—Elliot Frank
(74) Attorney, Agent, or Firm—Fitzpatrick, Cella, Harper & Scinto

(57) ABSTRACT

This invention is to sufficiently reduce a change in optical characteristic of an optical system due to gas mixture in each space in the optical system and to resolve a pattern image with a small line width. A projection optical system (22) has lenses (2a–2c) as a plurality of optical elements, a holding member (3) for holding the lenses, and a lens barrel (1) serving as a vessel for accommodating the lenses (2a–2c) and holding member (3). The lens barrel (1) has at least two spaces (51a, 51b) inside. A gas contained in one space (51a) has a refractive index different from that of a gas contained in the other space (51b). The pressure of the gas in one space (51a) is different from that of the gas in the other space 51b. The vessel (1) has gas supply ports (5a, 5c) for independently supplying the gases into the two spaces (51a, 51b) and gas exhaust ports (5b, 5d) for exhausting the gases.

15 Claims, 10 Drawing Sheets

FIG. 11

| | |
|---|---|
| URL | http://www.maintain.co.jp/db/input.html |

TROUBLE DB INPUT WINDOW

OCCURRENCE DATE [2000/3/15] ~404
TYPE OF APPARATUS [**********] ~401
SUBJECT [OPERATION ERROR (START-UP ERROR)] ~403
SERIAL NUMBER S/N [465NS4580001] ~402
DEGREE OF URGENCY [D] ~405

SYMPTOM [LED IS KEPT FLICKERING AFTER POWER-ON] ~406

REMEDY [POWER ON AGAIN (PRESS RED BUTTON IN ACTIVATION)] ~407

PROGRESS [INTERIM HAS BEEN DONE] ~408

[SEND] [RESET]   410                411                412
LINK TO RESULT LIST DATABASE   SOFTWARE LIBRARY   OPERATION GUIDE

SEMICONDUCTOR DEVICE MANUFACTURING FLOW

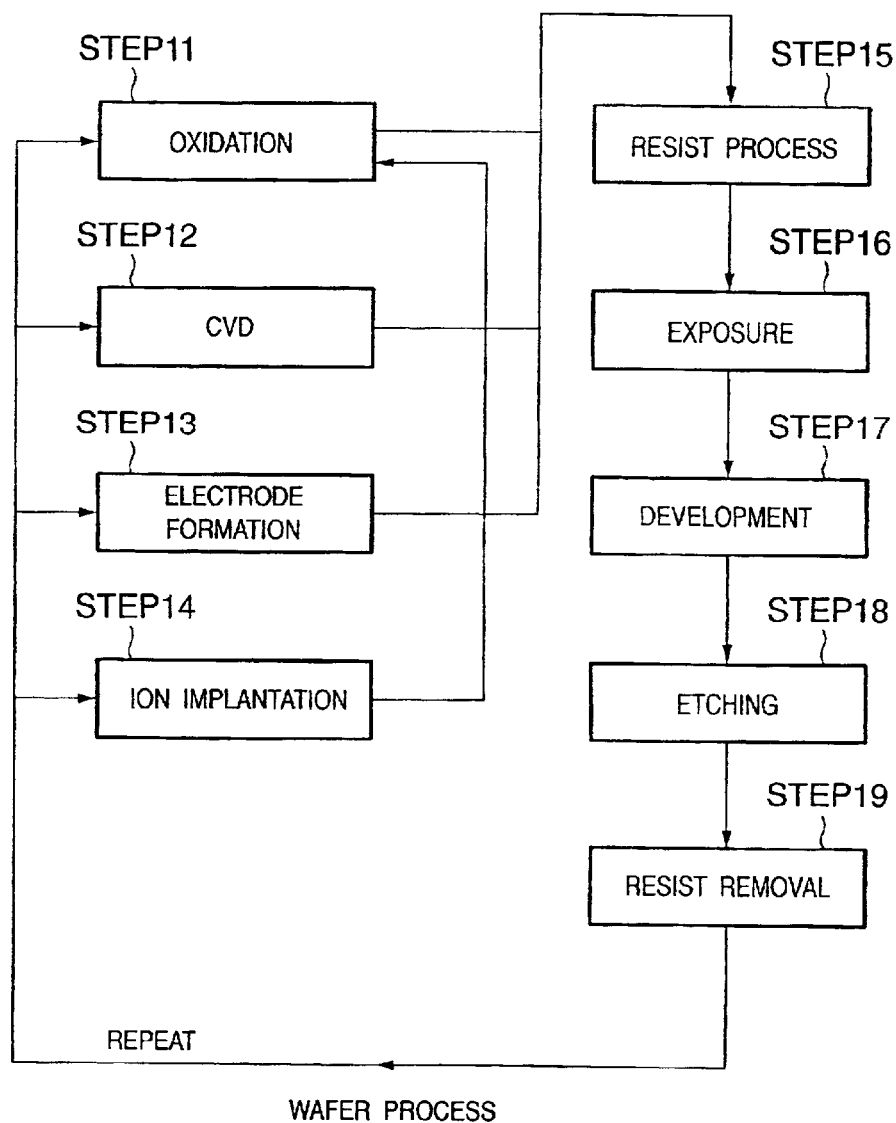

EXPOSURE APPARATUS

FIELD OF THE INVENTION

The present invention relates to an exposure apparatus used to manufacture a semiconductor device.

BACKGROUND OF THE INVENTION

Recently, strong demands have arisen for a higher density and higher integration degree of semiconductor integrated circuits. In addition, to improve the productivity of semiconductor elements, the exposure time is required to be shorter. In lithography, for processing a circuit pattern, an exposure apparatus using, as a light source, far UV light or an excimer laser beam capable of obtaining high illuminance at a short wavelength is generally used for micropatterning and a shorter exposure time.

This technique readily activates a gas around the optical elements of an illumination optical system or projection optical system as it is irradiated with light. For this reason, there is a high probability of the surfaces of the optical elements becoming contaminated. A method of preventing contamination has been proposed in which the optical elements of an illumination optical system or projection optical system are accommodated in a closed vessel or the like, and the vessel is filled or replaced with clean dry air or an inert gas, thereby preventing contamination of the internal optical elements.

For an exposure apparatus for projecting and exposing a finer circuit pattern using an ArF excimer laser beam (wavelength: 193 nm), a method has been proposed in which glass materials of at least two types, such as molten silica and fluorite, are used to form the refraction optical elements of a projection optical system, the space in the projection optical system is divided into at least two spaces, and at least one of these spaces is filled with a gas having a refractive index different from that of a gas in the other space, thereby improving the characteristics (optical performance) of the projecting lens.

For a projection optical system, the gas in the optical system must be purged for several purposes as described above. The present invention is applied to improve the optical performance, especially in an apparatus for projecting and exposing a micropattern, by dividing the internal space of a projection optical system into two or more spaces and filling the respective spaces with gases having different refractive indices.

In this case, the boundary portion between the spaces is formed from a refraction optical element (lens) and a lens holding member. To specially shield the boundary portion, an O-ring or adhesive (or filler) is used.

When an O-ring made of rubber (e.g., fluororubber) is used, sufficient sealing properties are obtained in general. However, in the arrangement shown in FIG. 1, when a sufficient crush amount is given to the O-ring, excessive deformation or internal stress is produced in the lens through the lens holding member, resulting in degradation in optical performance of the projecting lens.

If an adhesive (or filler) 12 is used, as shown in FIG. 7, a degassed component from the adhesive or filler 12, or a chemical reaction component between the degassed component and exposure light or heat sticks to the lens, resulting in degradation in optical performance of the projecting lens.

If a simple fitting or an O-ring with poor sealing properties is used, the gases in the respective spaces mix to change the refractive index of each gas. For this reason, predetermined optical performance may not be obtained.

Hence, a purge method and structure capable of sufficiently satisfying the optical performance of the projecting lens using a lens barrel structure capable of preventing any change and stress generation in a lens at the boundary portion between purge spaces must be established.

SUMMARY OF THE INVENTION

It is an object of the present invention to provide an exposure apparatus which can resolve a pattern image with a small line width by, in an optical system having a plurality of spaces filled with two or more gases with different refractive indices, sufficiently reducing a change in optical characteristic of the optical system due to gas mixing between the spaces.

In order to solve the above problem and to achieve the above object, according to the present invention, there is provided an exposure apparatus comprising an optical system having a plurality of spaces and a mechanism that fills each of the spaces with a gas, a gas contained at least in one of the plurality of spaces has a refractive index different from that of a gas contained at least in one of the remaining spaces, and a pressure of the gas at least in the one of the plurality of spaces is different from that of the gas at least in the one of the remaining spaces. The apparatus may be such wherein the optical system comprises a plurality of optical elements, a holding member for holding the optical elements, and a vessel for accommodating the optical elements and the holding member, the vessel having the plurality of spaces inside.

If no sufficient sealing properties are obtained at the boundary portion between the plurality of spaces, the gas leaks from the high-pressure-side vessel space to the low-pressure-side vessel space in the above arrangement. Hence, the leakage gas from the high-pressure-side space mixes into the low-pressure-side space. The resultant gas mixture has a refractive index different from that of the initial gas.

The air space portion of a projection optical system or the like generally has a space sensitive to a change in optical performance (mainly, generation of aberration) due to a change in refractive index of a gas and an insensitive space.

In consideration of the above situation, a purge system is formed in the optical system to set a high pressure in the optically sensitive space and a low pressure in the insensitive space. With this arrangement, an optical system can be constructed in which a change in refractive index of the optically sensitive space can be suppressed to be low, the entire optical system can be made insensitive to gas leakage between the spaces, i.e., the design value can be perfectly satisfied, and a change in optical performance can be sufficiently reduced.

The space seal structure determination and pressure difference setting between the spaces are done within the allowance for gas leakage to satisfy the optical performance.

As a preferable form of the present invention, at least two of the plurality of spaces may be adjacent to each other. The pressure difference between the plurality of spaces is preferably a small pressure difference of 1,000 Pa or less. When an influence of an index change rate of the gas at least in the one space on an optical characteristic of the optical system is larger than an influence of an index change rate of the gas at least in the one of the remaining spaces on the optical characteristic of the optical system, the pressure of the gas at least in the one space is preferably higher than that of the gas at least in the one of the remaining spaces.

The vessel preferably has at least one gas supply port for independently supplying the gas to each of the plurality of spaces and one gas exhaust port for exhausting the gas. The vessel preferably has a closed structure having no opening portion except for the gas supply port and gas exhaust port. The apparatus preferably further comprises a detection section for detecting an internal pressure of the vessel, and a operation section for operating the internal pressure in accordance with an output from the detection section.

The plurality of gases with different refractive indices may be helium and nitrogen. Each gas may be a single gas or a mixture of gases of a plurality of types.

The present invention includes a semiconductor device manufacturing method comprising the steps of installing manufacturing apparatuses for performing various processes in a semiconductor manufacturing factory, including one of the above exposure apparatuses, and manufacturing a semiconductor device in a plurality of processes by using the manufacturing apparatuses. The method may further comprise the steps of connecting the manufacturing apparatuses by a local area network, and communicating information about at least one of the manufacturing apparatuses between the local area network and an external network of the semiconductor manufacturing factory. Maintenance information of the manufacturing apparatus can be acquired by data communication by accessing a database provided by a vendor or user of the exposure apparatus via the external network, or production can be managed by data communication via the external network with a semiconductor manufacturing factory other than the semiconductor manufacturing factory.

The present invention can also be applied to a semiconductor manufacturing factory comprising manufacturing apparatuses for performing various processes, including the above exposure apparatus, a local area network for connecting the manufacturing apparatuses, and a gateway for allowing the local area network to access an external network of the factory, wherein information about at least one of the manufacturing apparatuses is communicated by connection to the external network. The present invention can also be applied to a maintenance method for an exposure apparatus installed in a semiconductor manufacturing factory, comprising the steps of causing a vendor or user of the exposure apparatus to provide a maintenance database connected to an external network of the semiconductor manufacturing factory, authenticating access from the semiconductor manufacturing factory to the maintenance database via the external network, and transmitting maintenance information accumulated in the maintenance database to the semiconductor manufacturing factory via the external network.

The present invention can also be applied to an exposure apparatus comprising a display, a network interface, and a computer for executing network software, wherein maintenance information can be communicated to the exposure apparatus via a computer network. In this case, the network software may be connected to an external network of a factory where the exposure apparatus is installed, provide on the display a user interface for accessing a maintenance database provided by a vendor or user of the exposure apparatus, and enable one to obtain information from the database via the external network.

Other objects and advantages besides those discussed above shall be apparent to those skilled in the art from the description of a preferred embodiment of the invention which follows. In the description, reference is made to accompanying drawings, which form a part thereof, and which illustrate an example of the invention. Such an example, however, is not exhaustive of the various embodiments of the invention, and, therefore, reference is made to the claims which follow the description for determining the scope of the invention.

BRIEF DESCRIPTION OF THE DRAWINGS

FIG. 11 is a view showing a detailed example of a user interface;

FIG. 13 is a flow chart for explaining a wafer process.

DETAILED DESCRIPTION OF THE PREFERRED EMBODIMENTS

First Embodiment

Figure 1:
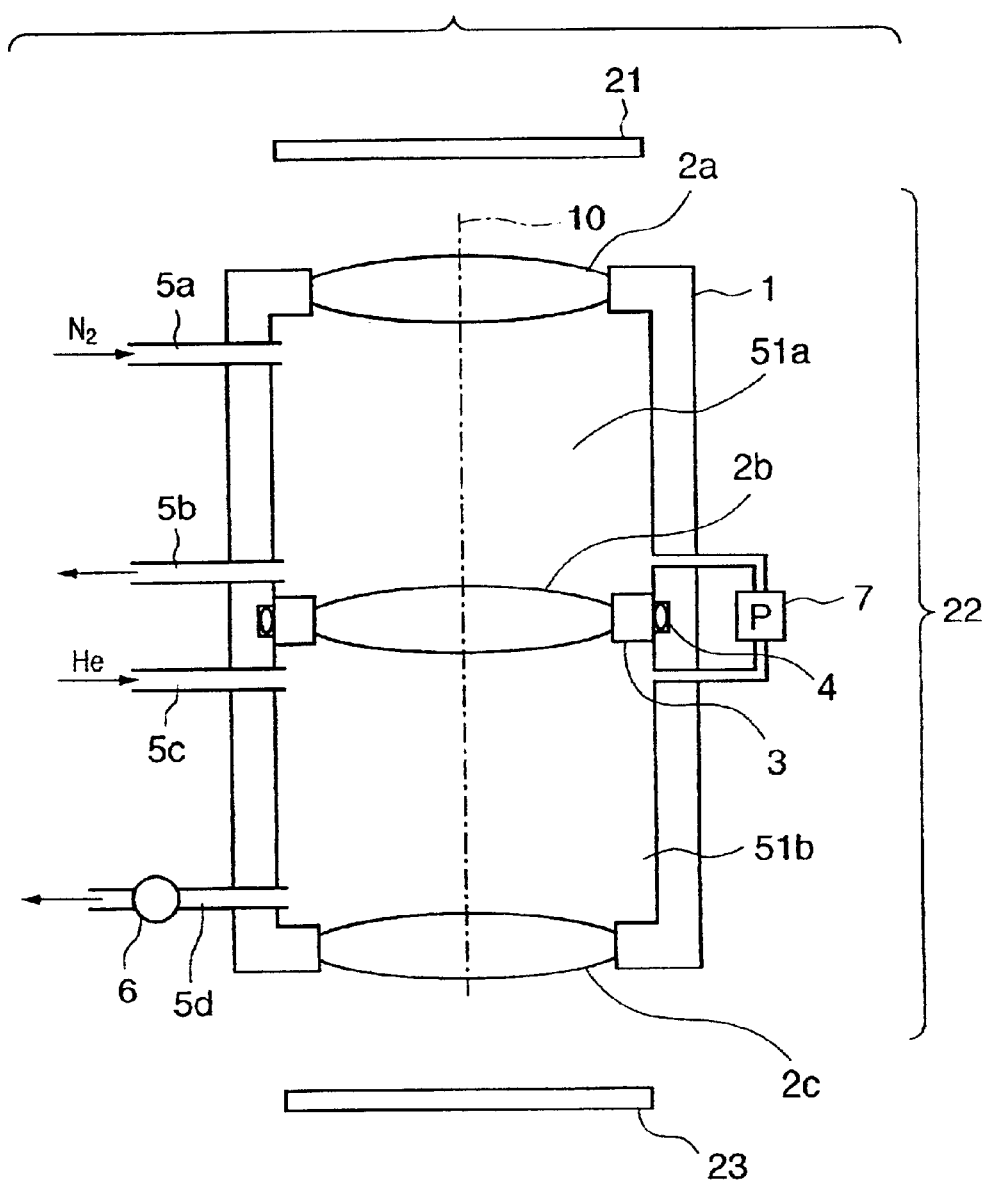
FIG. 1 is a schematic view for mainly explaining the projection optical system of an exposure apparatus according to the first embodiment of the present invention.

An embodiment of the present invention will be described in detail with reference to the accompanying drawings by exemplifying a projection optical system. FIG. 1 is a schematic view mainly showing the projection optical system of an exposure apparatus according to the first embodiment of the present invention.

Referring to FIG. 1, a circuit pattern drawn on a mask 21 is illuminated with an i-line (wavelength: 365 nm) of a mercury lamp, a KrF excimer laser beam (wavelength: 248 nm), or an ArF excimer laser beam (wavelength: 193 nm) by an illumination optical system (not shown) with a uniform illuminance distribution. The image of the circuit pattern is projected and exposed onto a wafer 23 through a projection optical system 22. Reference numerals 2a to 2c schematically denote lenses; 3, a lens holding member; and 1, a lens barrel serving as a vessel.

In this projection optical system 22, the two ends of the lens barrel 1 are closed by the lenses 2a and 2c. The internal space of the lens barrel 1 is closed except for gas supply/exhaust ports 5a to 5d. There is almost no gas exchange (leakage) from any portion other than the gas supply/exhaust ports 5a.

The internal space of the lens barrel 1 is divided into spaces 51a and 51b by the lens 2b and lens holding member 3. The spaces 51a and 51b are respectively filled with nitrogen gas (to be referred to as $N_2$ hereinafter) and helium gas (to be referred to as He hereinafter) through the gas supply/exhaust ports 5a to 5d. The lens layout and purged gases are optically optimized. In this embodiment, $N_2$ and He are used to reduce aberration of the projection optical system using the pressure sensitivity of the refractive index of each gas or the index difference between the gases.

The description of this embodiment assumes that the projection optical system has the following aberration sensitivity.

An aberration change amount in projection optical system 22 when $H_2$ (about 0.1%) leaks to He space 51b> an aberration change amount in the projection optical system when He (about 0.1%) leaks to the $N_2$ space 51a. Hence, to satisfy the ideal performance of the projection optical system, it is preferable to completely eliminate gas exchange (leakage) between the spaces. The gas purge system must be designed at least such that He leaks to the $N_2$ space 51a.

Figure 4:
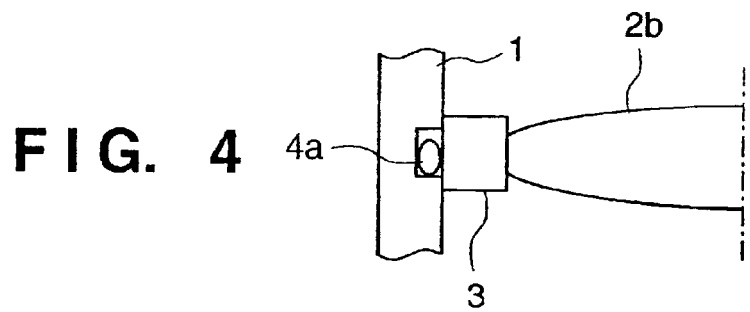
FIG. 4 is a partial view showing the main part so as to explain a purge space sealing method according to the embodiment of the present invention.

To prevent leakage between the spaces in FIG. 1, an O-ring 4 is arranged. To improve the hermetic sealing between the spaces 51a and 51b, an O-ring 4a formed from rubber (e.g., fluororubber with relatively little degassing) as shown in FIG. 4 is preferably used. However, due to a compressive load or frictional force generated by crushing the O-ring 4, an external force in the radial direction or in a direction parallel to an optical axis 10 acts on the lens 2b through the lens holding member 3. This may deform the lens 2b or generates stress on the lens 2b and adversely influence the optical characteristic. To prevent this, a seal structure which prevents deformation of the lens 2b or actual adverse influence on the optical characteristic while ensuring sealing properties of a predetermined level or more must be employed.

Figure 5:
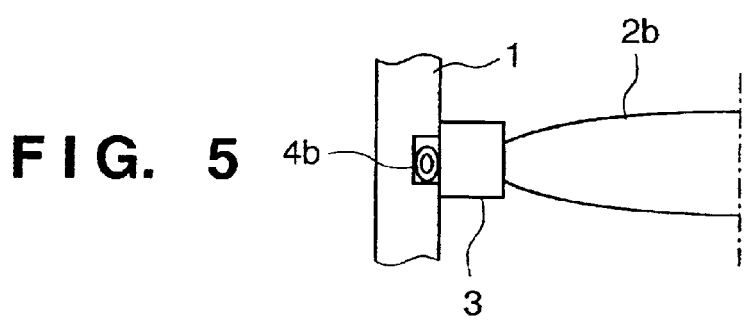
FIG. 5 is a partial view showing the main part so as to explain a purge space sealing method according to the embodiment of the present invention.

For example, an O-ring 4b shown in FIG. 5 has a hollow section at its center and a surface covered with a Teflon tube (not shown). When this O-ring 4b is used, the compressive load can be suppressed to about ⅓ that in the example shown in FIG. 4 at the same compression ratio (crush amount), and the frictional force can also be made small. Hence, the adverse influence on the optical characteristic of the lens can be reduced.

Figure 6:
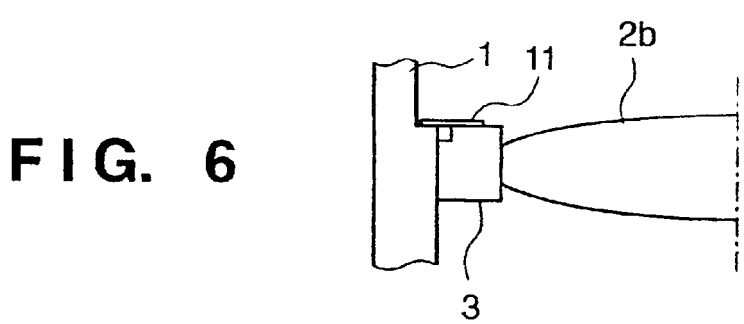
FIG. 6 is a partial view showing the main part so as to explain a purge space sealing method according to the embodiment of the present invention.
Figure 7:
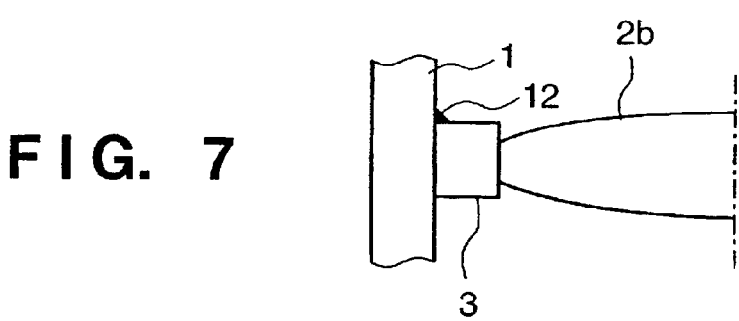
FIG. 7 is a partial view showing the main part so as to explain a purge space sealing method according to the problem of the present invention.

Even when a film-like sheet 11 is bonded to the lens barrel 1 and lens holding member 3, as shown in FIG. 6, a seal structure without any adverse influence on the lens optical performance can be obtained. The film-like sheet 11 may have a screwed structure (not shown) using a press ring or the like from the viewpoint of a detachment operation during the manufacture.

As described above, the adverse influence on the optical performance by lens deformation or stress can be reduced by the method shown in FIG. 5 or 6. However, it is difficult to ensure complete sealing properties.

To compensate for the incomplete sealing properties, a means for generating a small pressure difference between the spaces 51a and 51b can be effectively used.

The pressure difference between the spaces 51a and 51b can be monitored by a small differential pressure gauge 7. The $N_2$ flow rate from the gas supply port 5a and the He flow rate from the gas supply port 5c are adjusted to predetermined levels in advance. When a restrictor 6 is adjusted such that the pressure of the He purge space 51b becomes slightly higher than that in the $N_2$ purge space 51a while monitoring the output from the small differential pressure gauge 7, the $N_2$ flow into the He purge space 51b can be suppressed.

The restrictor 6 may have a fixed orifice form as long as it can fix each flow rate. After setting the conditions, the small differential pressure gauge 7 may be detached. Alternatively, the restrictor 6 may be automatically adjusted while automatically monitoring the output value of the small differential pressure gauge 7 such that a predetermined pressure difference can always be managed.

Experiments were conducted to verify an effect based on this embodiment. An example will be described below.

Referring to FIG. 1, a hollow O-ring 4b (diameter: about 300 mm) was used as a sealing member around a lens 2b serving as a partition and a lens holding member 3. He purge was performed for a space 51b (spatial volume: about 20 L) at a filling rate of 1 NL/min. The pressure in the space 51b was set to +100 Pa (pressure difference with respect to outer air) by a restrictor 6. For a space 51a (volume: about 10 L), air was purged instead of $N_2$ at a predetermined filling rate, and pressure control was performed by a stop (not shown). Air was used to use the oxygen concentration as an index for simply measuring gas leakage from the space 51a to the space 51b. A zirconia-type oxygen densitometer (not shown) was connected to the downstream portion of an gas exhaust port 5d to measure the oxygen concentration of the exhaust gas from the space 51b. Since the oxygen concentration in air is about 21%, the air leakage amount to the He purge space (air leakage concentration in the space) can be obtained by multiplying the measured oxygen concentration by about 4.8. In this experimental system, it was difficult to completely prevent outer air from entering into a lens barrel 1. To avoid this influence, the He purge space 51b was set to a predetermined pressure such that constant leakage from the outer space occurred.

Figure 8:
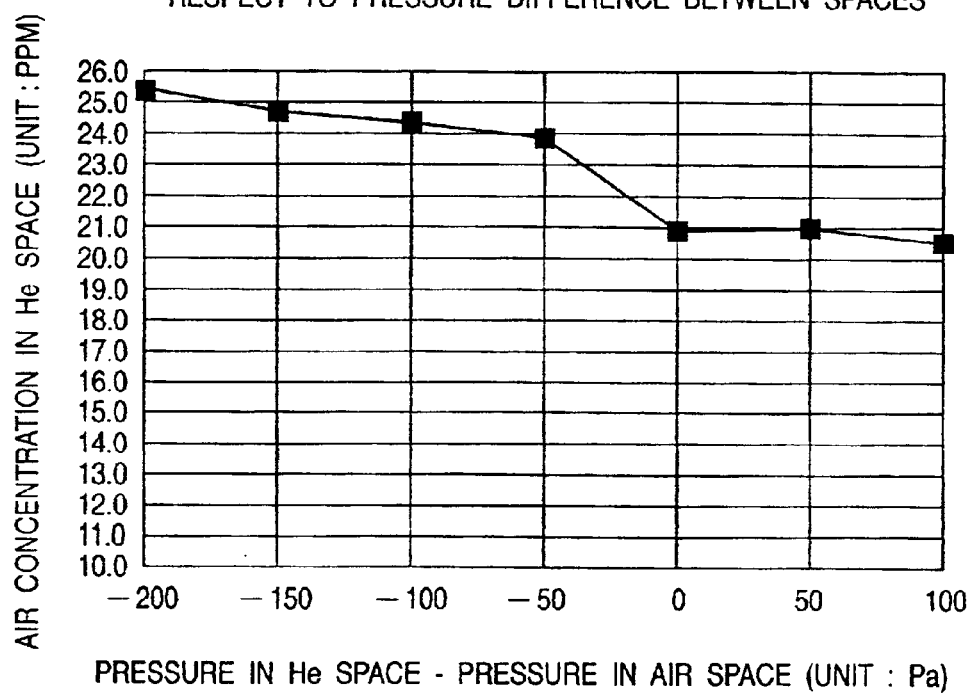
FIG. 8 is a graph for explaining the effect of the exposure apparatus according to the first embodiment of the present invention.

FIG. 8 shows the result of the above experiment. The abscissa represents the pressure difference between the two spaces, and the ordinate represents the concentration of air leaking into the He space. As is apparent from this result, as the pressure difference between the two spaces changes, the concentration of leakage air changes. Especially, the leakage amount remarkably changes when the pressure on the He space 51b side changes from the negative pressure to the positive pressure. As described above, outer air could not completely prevented from entering into the lens barrel 1. For this reason, the absolute numerical values of this result are mere reference values, and only the tendency of leakage amount along with the change in pressure state has been described above.

Second Embodiment

In the first embodiment, a projection optical system constructed by lenses (refraction optical elements) has been described. However, the projection optical system may be a projection optical system (reflection/refraction optical system) including a mirror (reflection optical element).

Figure 2:
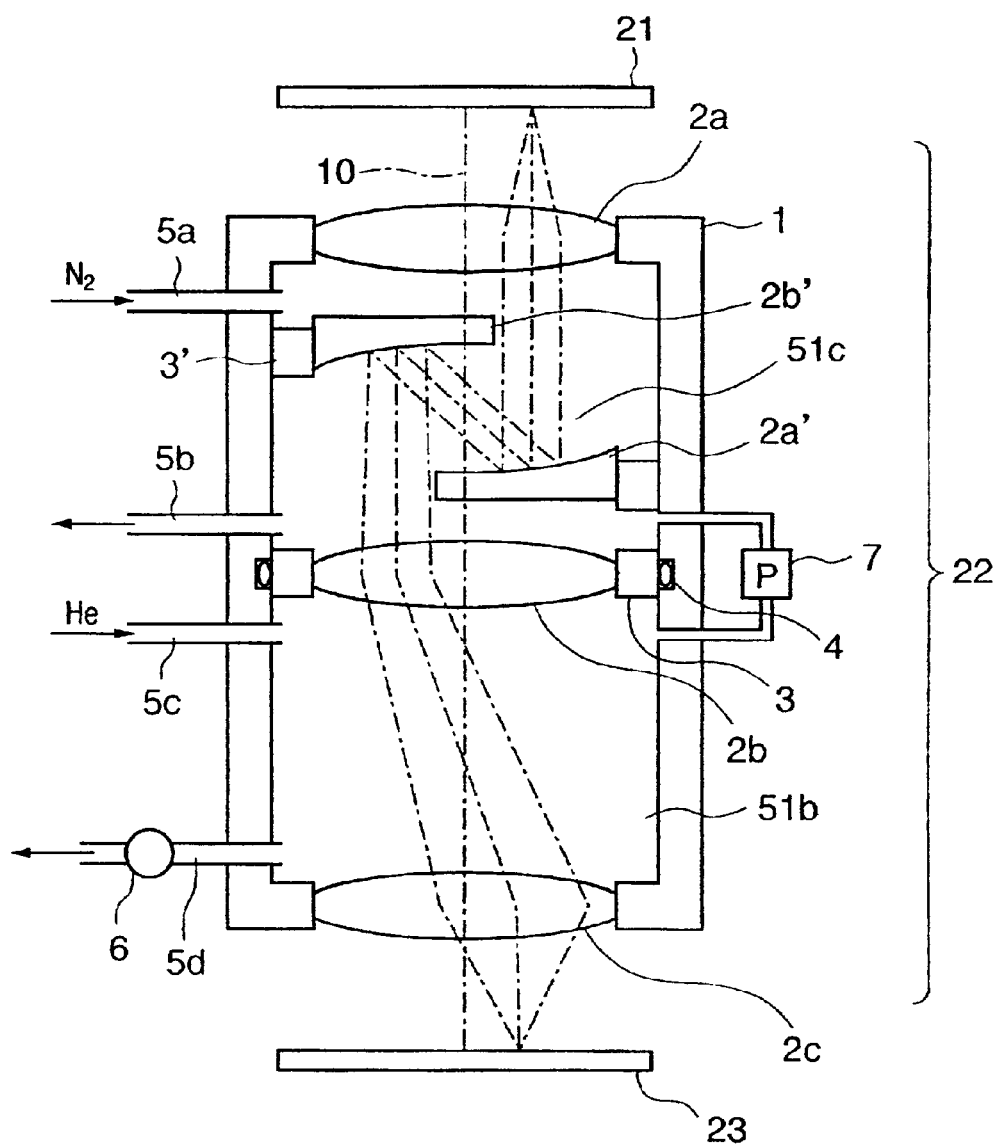
FIG. 2 is a schematic view for mainly explaining the projection optical system of an exposure apparatus according to the second embodiment of the present invention.

FIG. 2 is a schematic view showing the projection optical system including mirrors according to the second embodiment of the present invention.

Referring to FIG. 2, the internal space of a lens barrel 1 is divided into spaces 51c and 51b by a lens 2b and lens holding member 3. Mirrors 2a' and 2b' are fixed to the lens barrel 1 through mirror holding members 3' in the space 51c. The remaining parts have the same arrangement as in FIG. 1.

In this embodiment, two mirrors 2b' are arranged in one space. However, the mirrors may be arranged in a plurality of spaces, and the number of mirrors is not limited to two.

Third Embodiment

Figure 3:
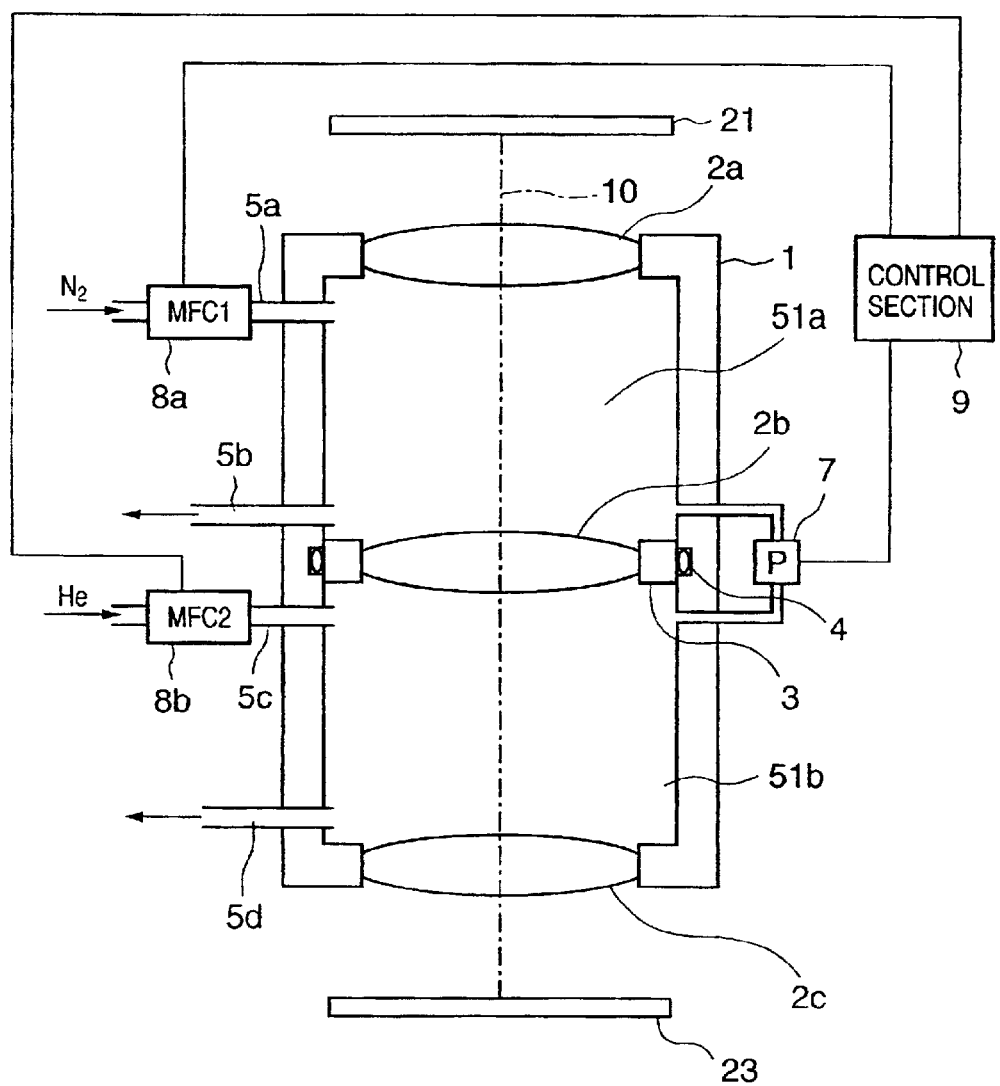
FIG. 3 is a schematic view for mainly explaining the projection optical system of an exposure apparatus according to the third embodiment of the present invention.

FIG. 3 is a schematic view mainly showing the projection optical system of an exposure apparatus according to the third embodiment of the present invention. The purpose and basic arrangement are the same as in the first embodiment.

The pressure difference between spaces 51a and 51b can be monitored by a small differential pressure gauge 7, as in the first embodiment. The $N_2$ flow rate from a gas supply port 5a can be controlled by a mass flow controller 8a. The He flow rate from a gas supply port 5c can be controlled by a mass flow controller 8b. Since the arrangement of the gas exhaust system of the spaces 51a and 51b is fixed (the pressure loss coefficient is always constant), the pressures in the spaces 51a and 51b can be controlled by adjusting the gas flow rates.

The mass flow controllers 8a and 8b are controlled on the basis of the output signal from the small differential pressure gauge 7 such that the pressure in the He space 51b becomes slightly higher than that in the space 51a. In this embodiment, only management of the pressure difference between the spaces 51a and 51b suffices. Hence, the flow rate of one of the mass flow controllers 8a and 8b may be fixed, and the pressure difference may be controlled only by adjusting the other flow rate.

In the first to third embodiments, the methods of purging gases with different refractive indices for two spaces to generate a pressure difference, thereby reducing the adverse influence of gas leakage on the performance of the projection optical system 22 have been described. Three or more spaces may be used. In place of He and $N_2$, any other inert gas or a gas mixture of two or more gases may be used.

The pressure difference set value is optimized on the basis of the sealing properties of the partition portion or the optical sensitivity to gas leakage to each space. If the pressure difference is too large, the refractive index of the gas changes along with the change in pressure, adversely influencing the performance of the projection optical system. Preferably, the low-pressure-side space is set to open air or an equivalent pressure, and the high-pressure-side space is set to generate a small pressure difference of about +10 to 1,000 Pa.

The present invention can be applied not only to the projection optical system in the above embodiments but also to an illumination optical system.

Embodiment of A Semiconductor Production System

A production system for producing a semiconductor device (e.g., a semiconductor chip such as an IC or an LSI, a liquid crystal panel, a CCD, a thin-film magnetic head, a micromachine, or the like) using an exposure apparatus of the present invention will be exemplified. A trouble remedy or periodic maintenance of a manufacturing apparatus installed in a semiconductor manufacturing factory, or maintenance service such as software distribution is performed by using a computer network outside the manufacturing factory.

Figure 9:
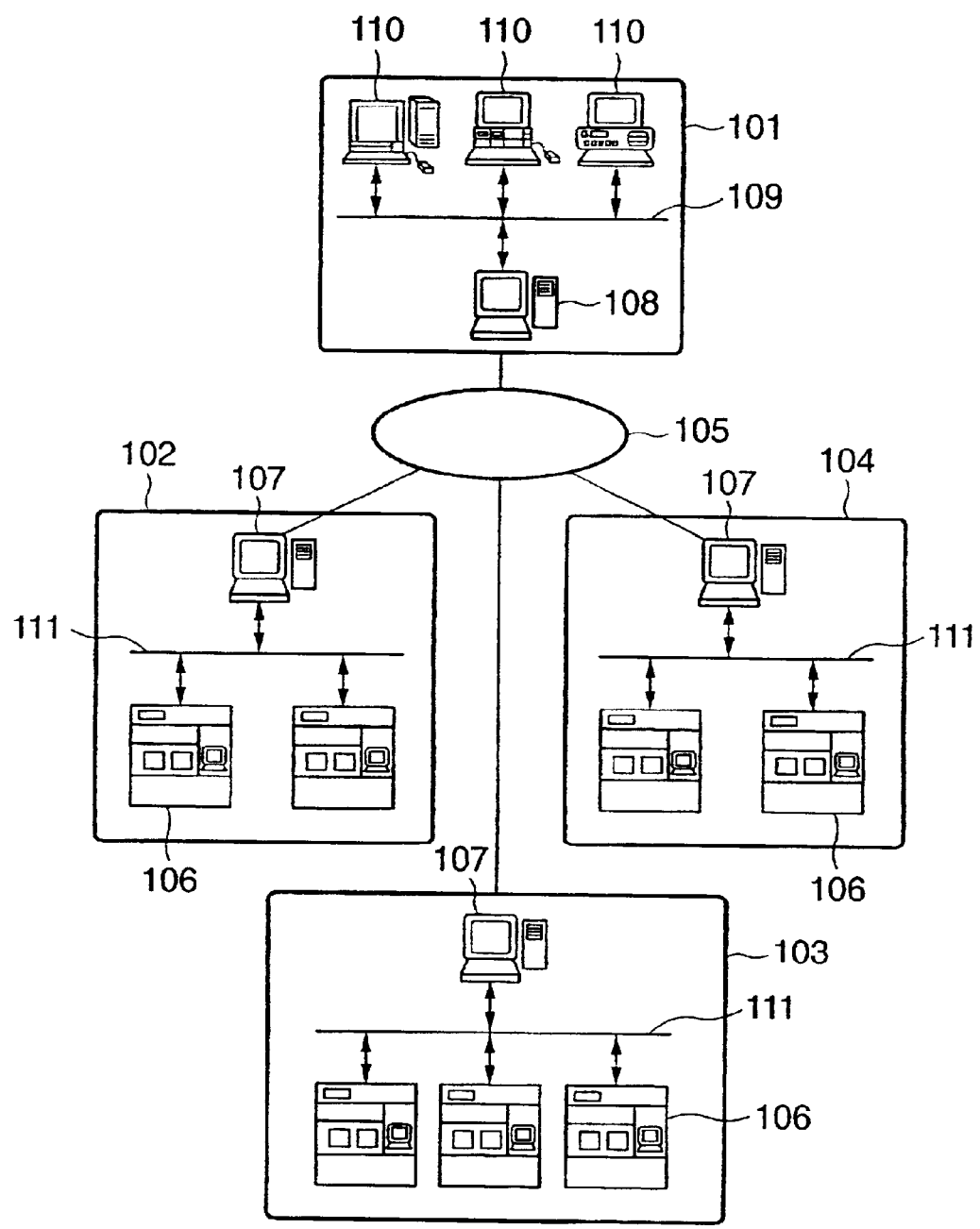
FIG. 9 is a schematic view showing a semiconductor device production system using the exposure apparatus according to the present invention at a given angle.

FIG. 9 shows the overall system cut out at a given angle. In FIG. 9, reference numeral 101 denotes a business office of a vendor (e.g., an apparatus supply manufacturer) which provides a semiconductor device manufacturing apparatus. Assumed examples of the manufacturing apparatus are semiconductor manufacturing apparatuses for performing various processes used in a semiconductor manufacturing factory, such as pre-process apparatuses (e.g., lithography apparatus including an exposure apparatus, a resist processing apparatus, and an etching apparatus, an annealing apparatus, a film formation apparatus, a planarization apparatus, and the like) and post-process apparatuses (e.g., an assembly apparatus, an inspection apparatus, and the like). The business office 101 comprises a host management system 108 for providing a maintenance database for the manufacturing apparatus, a plurality of operation terminal computers 110, and a LAN (Local Area Network) 109, which connects the host management system 108 and computers 110 to construct an intranet. The host management system 108 has a gateway for connecting the LAN 109 to Internet 105 as an external network of the business office, and a security function for limiting external accesses.

Reference numerals 102 to 104 denote manufacturing factories of the semiconductor manufacturer as users of manufacturing apparatuses. The manufacturing factories 102 to 104 may belong to different manufacturers or the same manufacturer (e.g., a pre-process factory, a post-process factory, and the like). Each of the factories 102 to 104 is equipped with a plurality of manufacturing apparatuses 106, a LAN (Local Area Network) 111, which connects these apparatuses 106 to construct an intranet, and a host management system 107 serving as a monitoring apparatus for monitoring the operation status of each manufacturing apparatus 106. The host management system 107 in each of the factories 102 to 104 has a gateway for connecting the LAN 111 in the factory to the Internet 105 as an external network of the factory. Each factory can access the host management system 108 of the vendor 101 from the LAN 111 via the Internet 105. The security function of the host management system 108 authorizes access of only a limited user. More specifically, the factory notifies the vendor via the Internet 105 of status information (e.g., the symptom of a manufacturing apparatus in trouble) representing the operation status of each manufacturing apparatus 106. The factory can receive, from the vendor, response information (e.g., information designating a remedy against the trouble, or remedy software or data) corresponding to the notification, or maintenance information such as the latest software or help information. Data communication between the factories 102 to 104 and the vendor 101 and data communication via the LAN 111 in each factory adopt a communication protocol (TCP/IP) generally used in the Internet. Instead of using the Internet as an external network of the factory, a dedicated-line network (e.g., an ISDN) having high security, which inhibits access of a third party, can be adopted. It is also possible that the user constructs a database in addition to one provided by the vendor and sets the database on an external network and that the host management system authorizes access to the database from a plurality of user factories.

Figure 10:
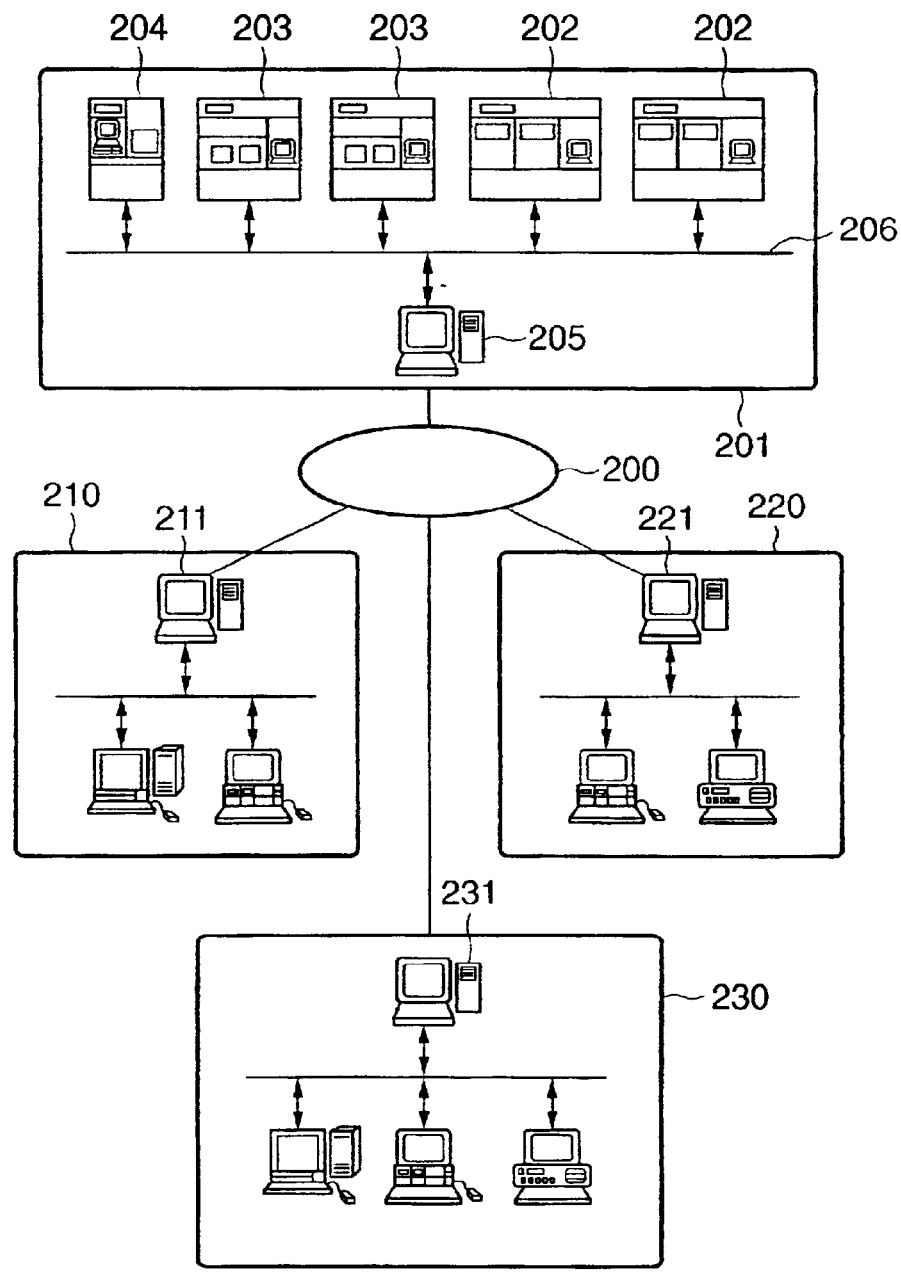
FIG. 10 is a schematic view showing the semiconductor device production system using the exposure apparatus according to the present invention at another angle.

FIG. 10 is a view showing the concept of the overall system of this embodiment that is cut out at a different angle from FIG. 9. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 10, a factory having manufacturing apparatuses of a plurality of vendors, and the management systems of the vendors for these manufacturing apparatuses are connected via the external network of the factory, and maintenance information of each manufacturing apparatus is communicated. In FIG. 10, reference numeral 201 denotes a manufacturing factory of a manufacturing apparatus user (e.g., a semiconductor device manufacturer) where manufacturing apparatuses for performing various processes, e.g., an exposure apparatus 202, a resist processing apparatus 203, and a film formation apparatus 204 are installed in the manufacturing line of the factory. FIG. 10 shows only one manufacturing factory 201, but a plurality of factories are networked in practice. The respective apparatuses in the factory are connected to a LAN 206 to construct an intranet, and a host management system 205 manages the operation of the manufacturing line.

The business offices of vendors (e.g., apparatus supply manufacturers) such as an exposure apparatus manufacturer 210, a resist processing apparatus manufacturer 220, and a film formation apparatus manufacturer 230 comprise host management systems 211, 221, and 231 for executing remote maintenance for the supplied apparatuses. Each host management system has a maintenance database and a gateway for an external network, as described above. The host management system 205 for managing the apparatuses in the manufacturing factory of the user, and the management systems 211, 221, and 231 of the vendors for the respective apparatuses are connected via the Internet or dedicated-line network serving as an external network 200. If trouble occurs in anyone of a series of manufacturing apparatuses along the manufacturing line in this system, the operation of the manufacturing line stops. This trouble can be quickly solved by remote maintenance from the vendor of the apparatus in trouble via the Internet 200. This can minimize the stoppage of the manufacturing line.

Each manufacturing apparatus in the semiconductor manufacturing factory comprises a display, a network interface, and a computer for executing network access software and apparatus operating software which are stored in a storage device. The storage device is a built-in memory, hard disk, or network file server. The network access software includes a dedicated or general-purpose web browser, and provides a user interface having a window as shown in FIG. 11 on the display. While referring to this window, the operator who manages manufacturing apparatuses in each factory inputs, in input items on the windows, pieces of information such as a type 401 of manufacturing apparatus, serial number 402, subject of trouble 403, occurrence date 404, degree of urgency 405, symptom 406, remedy 407, and progress 408. The pieces of input information are transmitted to the maintenance database via the Internet, and appropriate maintenance information is sent back from the maintenance database and displayed on the display. The user interface provided by the web browser realizes hyperlink functions 410 to 412, as shown in FIG. 11. This allows the operator to access detailed information of each item, receive the latest-version software to be used for a manufacturing apparatus from a software library provided by a vendor, and receive an operation guide (help information) as a reference for the operator in the factory. Maintenance information provided by the maintenance management system includes information related to the above-described present invention. The software library also provides the latest-version software for realizing the present invention.

Figure 12:
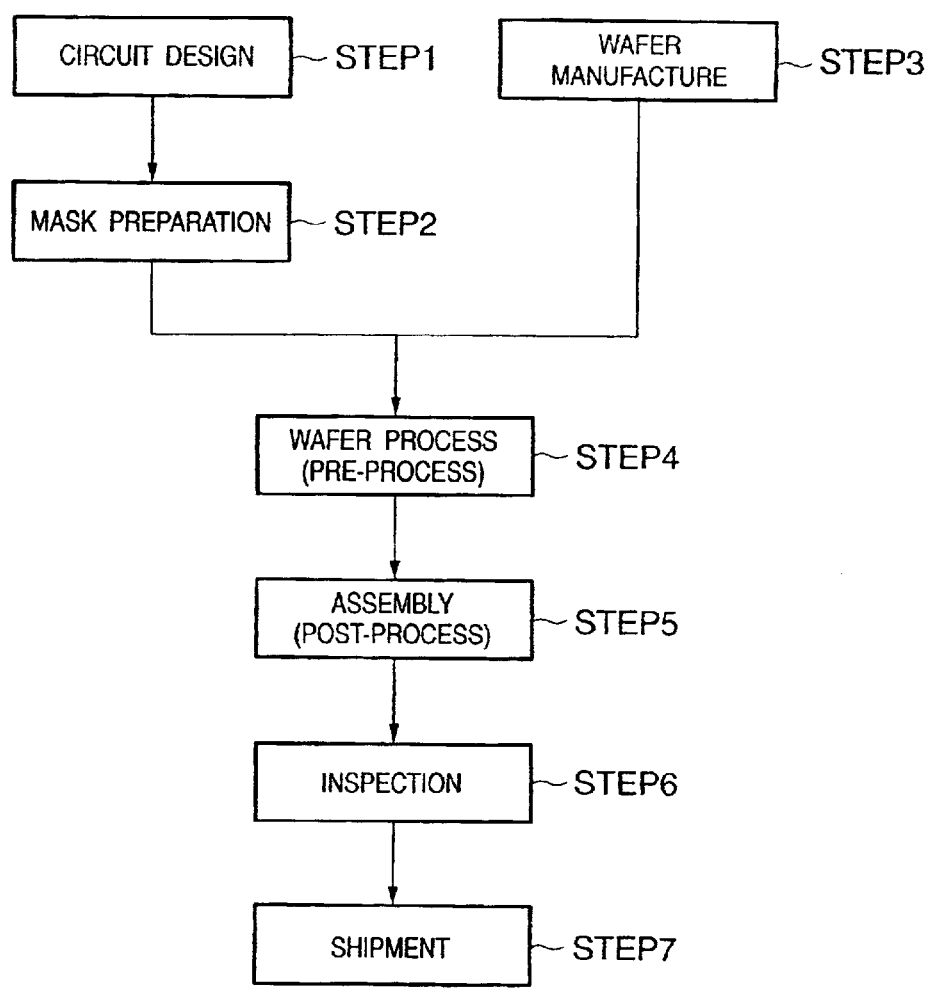
FIG. 12 is a flow chart for explaining the flow of a device manufacturing process.

A semiconductor device manufacturing process using the above-described production system will be explained next. FIG. 12 shows the flow of the whole manufacturing process of the semiconductor device. In step 1 (circuit design), a semiconductor device circuit is designed. In step 2 (mask preparation), a mask having the designed circuit pattern is prepared. In step 3 (wafer manufacture), a wafer is manufactured using a material such as silicon. In step 4 (wafer process), called a pre-process, an actual circuit is formed on the wafer by lithography using the prepared mask and wafer. Step 5 (assembly), called a post-process, is the step of forming a semiconductor chip by using the wafer manufactured in step 4, and includes an assembly process (dicing and bonding) and a packaging process (chip encapsulation). In step 6 (inspection), inspections such as the operation confirmation test and durability test of the semiconductor device manufactured in step 5 are conducted. After these steps, the semiconductor device is completed and shipped (step 7). The pre-process and post-process are performed in separate dedicated factories, and maintenance is done for each of the factories by the above-described remote maintenance system. Information for production management and apparatus maintenance is communicated between the pre-process factory and the post-process factory via the Internet or dedicated-line network.

FIG. 13 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus bakes and exposes the circuit pattern of the mask on the wafer. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the above-described remote maintenance system, which prevents trouble in advance. Even if trouble occurs, the manufacturing apparatus can be quickly recovered. The productivity of the semiconductor device can be increased in comparison with the prior art.

The present invention is not limited to the above embodiments and various changes and modifications can be made within the spirit and scope of the present invention. Therefore, to apprise the public of the scope of the present invention, the following claims are made.

What is claimed is:

1. An exposure apparatus comprising:
    a projection optical system for projecting a pattern formed on a mask, onto an object to be exposed, which projection optical system has a plurality of optical elements, wherein said projection optical system has a first space enclosed with two optical elements of the plurality of optical elements and filled with a helium gas, and a second space enclosed with two optical elements of the plurality of optical elements and filled with a nitrogen gas,
    wherein a pressure of the first space is higher than that of the second space.

2. The apparatus according to claim 1, wherein the first and second spaces are adjacent to each other.

3. The apparatus according to claim 2, wherein the first and second spaces are adjacent to each other via an optical element.

4. The apparatus according to claim 1, wherein the pressure difference between the first and second spaces is not more than 1,000 Pa.

5. The apparatus according to claim 1, further comprising:

a helium gas supply means for supplying the helium gas into the first space;

a first exhaust means for exhausting an internal gas of the first space;

a nitrogen gas supply means for supplying the nitrogen gas into the second space; and a second exhaust means for exhausting an internal gas of the second space.

6. The apparatus according to claim 1, further comprising a projection optical system for projecting exposure light from a pattern to an object to be exposed, wherein the first and second spaces are formed in the projection optical system.

7. The apparatus according to claim 1, wherein the first space is substantially closed except for an opening portion of the helium gas supply means and the first exhaust means.

8. The apparatus according to claim 7, further comprising:

a detection unit which detects the pressure of the first space; and an operation unit which operates the pressure of the first space based on the detection result of the detection unit.

9. The apparatus according to claim 1, wherein the second space is substantially closed except for an opening portion of the nitrogen gas supply means and the second exhaust means.

10. The apparatus according to claim 9, further comprising:

a detection unit which detects the pressure of the second space; and an operation unit which operates the pressure of the second space based on the detection result of the detection unit.

11. The apparatus according to claim 1, further comprising a support structure which supports the plurality of optical elements, wherein said first and second spaces are disposed inside the support structure.

12. A device manufacturing method comprising:

exposing an object by using an exposure apparatus which comprises a projection optical system for projecting a pattern formed on a mask, onto the object to be exposed, which projection optical system has a plurality of optical elements, the projection optical system having a first space enclosed with two optical elements of the plurality of optical elements and filled with a helium gas and a second space enclosed with two optical elements of the plurality of optical elements and filled with a nitrogen gas, with a pressure of the first space being higher than that of the second space; and developing the exposed object.

13. An exposure apparatus comprising:

a projection optical system for projecting light from a pattern formed on a mask illuminated by using a light source, onto an object to be exposed, which projection optical system has first, second and third optical elements;

first supply means for supplying a helium gas to a first space, which is contained by the first optical element and the second optical element;

first exhaust means for exhausting an atmosphere of the first space;

second supply means for supplying a nitrogen gas to a second space, which is contained by the second optical element and the third optical element; and second exhaust means for exhausting an atmosphere of the second space, wherein a pressure of the helium gas in the first space is higher than a pressure of the nitrogen gas in the second space.

14. The apparatus according to claim 13, further comprising a support structure which supports the plurality of optical elements, wherein said first and second spaces are disposed inside the support structure.

15. A device manufacturing method comprising:

exposing an object by using an exposure apparatus which comprises a projection optical system for projecting light from a pattern formed on a mask illuminated by using a light source, onto an object to be exposed, which projection optical system has first, second and third optical elements, first supply means for supplying a helium gas to a first space, which is contained by the first optical element and the second optical element, first exhaust means for exhausting an atmosphere of the first space, second supply means for supplying a nitrogen gas to a second space, which is contained by the second optical element and the third optical element, and second exhaust means for exhausting an atmosphere of the second space, wherein a pressure of the helium gas in the first space is higher than a pressure of the nitrogen gas in the second space; and developing the exposed object.

* * * * *

UNITED STATES PATENT AND TRADEMARK OFFICE
CERTIFICATE OF CORRECTION

PATENT NO.      : 6,853,871 B2
DATED           : February 8, 2005
INVENTOR(S)     : Hiroyuki Tomita It is certified that error appears in the above-identified patent and that said Letters Patent is hereby corrected as shown below:

Column 3,
Line 61, "network." should read as follows:
-- network.
      According to the present invention, an exposure apparatus capable of sufficiently reducing a change in optical characTeristic of an optical system having at least two spaces filled with gases and resolving a pattern image with a small line width can be provided. --

Column 6,
Line 46, "not" should read -- not be --.

Signed and Sealed this

Nineteenth Day of July, 2005

JON W. DUDAS
*Director of the United States Patent and Trademark Office*